United States Patent
Liao et al.

(10) Patent No.: US 12,424,994 B2
(45) Date of Patent: Sep. 23, 2025

(54) AMPLIFIER SYSTEM

(71) Applicant: REALTEK SEMICONDUCTOR CORP., Hsinchu (TW)

(72) Inventors: Chen-Fong Liao, Hsinchu (TW); Yi-Chang Tu, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 250 days.

(21) Appl. No.: 18/218,775

(22) Filed: Jul. 6, 2023

(65) Prior Publication Data

US 2024/0014791 A1 Jan. 11, 2024

(30) Foreign Application Priority Data

Jul. 11, 2022 (TW) .................................. 111125977

(51) Int. Cl.
*H03G 3/30* (2006.01)
*H03F 1/02* (2006.01)
*H03F 3/181* (2006.01)
*H04R 3/04* (2006.01)

(52) U.S. Cl.
CPC ......... *H03G 3/3026* (2013.01); *H03F 1/0255* (2013.01); *H03F 3/181* (2013.01); *H04R 3/04* (2013.01); *H03F 2200/03* (2013.01)

(58) Field of Classification Search
CPC ........ H03F 3/183; H03F 1/0255; H03F 3/181; H03F 3/2171; H03F 3/2175; H03F 2200/03; H03F 2200/331; H03G 3/3026; H03G 3/3005; H03G 3/3089; H04R 3/00; H04R 3/04; H04R 2430/01
USPC ......................................................... 381/107
See application file for complete search history.

(56) References Cited

U.S. PATENT DOCUMENTS

2006/0091945 A1* 5/2006 Wegner .................. H03F 3/217
330/10

* cited by examiner

*Primary Examiner* — Paul Kim
(74) *Attorney, Agent, or Firm* — Birch, Stewart, Kolasch & Birch, LLP

(57) ABSTRACT

An amplifier system includes an output circuit, a processor circuit, a feedback circuit, and a controller circuit. The output circuit outputs an output signal and returns a digital output feedback signal. The processor circuit receives a filtered error audio signal and outputs a pulse width modulation control signal to the output circuit. An addition unit of the feedback circuit adds the negative value of the digital output feedback signal to the digital input signal to obtain the error audio signal. A variable filter unit of the feedback circuit filters the error audio signal and outputs the filtered error audio signal. A compensation unit of the variable filter unit changes the gain characteristics of the variable filter unit. The controller circuit adjusts one or more parameters of the compensation unit according to a pre-compensation signal so as to change the gain characteristics of the variable filter unit.

17 Claims, 4 Drawing Sheets

AMPLIFIER SYSTEM

CROSS-REFERENCE TO RELATED APPLICATION

This non-provisional application claims priority under 35 U.S.C. § 119(a) to Patent Application No. 111125977 filed in Taiwan, R.O.C. on Jul. 11, 2022, the entire contents of which are hereby incorporated by reference.

BACKGROUND

Technical Field

The instant disclosure is related to an amplifier system, especially an amplifier system having a sigma-delta modulator (SDM), a digital pulse width modulation (DPWM), and feedback control.

Related Art

Digital pulse width modulation is often paired with feedback control, such as in an audio amplifier system known to the inventor. In this structure, a loop filter can be used to effectively suppress noises generated by the sigma-delta modulator, the digital pulse width modulator, and the power stage on the forward path, so as to improve total harmonic distortion plus noise (THD+N) at the output end. However, in the feedback control structure, overall stability has to be taken into consideration; inappropriate design may result in the instability of the system. Furthermore, in this structure, special attention needs to be paid to the stability of the sigma-delta modulator; it is noted that the stability of the sigma-delta modulator is limited by the amplitude of the input signals. For better performance, the gain of the loop filter should be as high as possible; however, as the gain of the loop filter increases, the sigma-delta modulator is prone to be unstable. If the gain of the loop filter is increased for better THD+N, the increased gain may result in instability of the sigma-delta modulator when large signals are inputted, and thus the dynamic range will have to be sacrificed. On the other hand, if the dynamic range cannot be sacrificed, the gain of the loop filter will have to be decreased, and the decreased gain will in turn result in sacrificed THD+N when small signals are inputted. Besides, when small signals are inputted, even if the gain of the loop filter is higher, the sigma-delta modulator can still remain stable.

As above, the instant disclosure provides an amplifier system to solve this problem.

SUMMARY

An embodiment of the instant disclosure provides an amplifier system. The amplifier system comprises an output circuit, a processor circuit, a feedback circuit, and a controller circuit. The output circuit is configured to output an output signal so as to drive a load and configured to return a digital output feedback signal. The processor circuit comprises a digital sigma-delta modulator. The processor circuit is configured to receive a filtered error audio signal and output a pulse width modulation (PWM) control signal to the output circuit according to the filtered error audio signal. The feedback circuit comprises a variable filter unit and an addition unit. The addition unit is configured to add a negative value of the digital output feedback signal to a digital input signal so as to obtain an error audio signal and transmit the error audio signal to the variable filter unit. The variable filter unit is configured to filter the error audio signal and output the filtered error audio signal. The variable filter unit comprises a compensation unit. The compensation unit of the variable filter unit is configured to change a gain characteristic of the variable filter unit. The controller circuit is configured to adjust at least one parameter of the compensation unit according to a signal amplitude of a pre-compensation signal, which has not been compensated by the compensation unit, on a forward path of the amplifier system so as to enable the compensation unit to change the gain characteristic of the variable filter unit.

As above, some embodiments of the instant disclosure provide an amplifier system. The controller circuit of the amplifier system adjusts the compensation unit according to a signal amplitude of a pre-compensation signal, which has not been compensated by the compensation unit, on a forward path of the amplifier system so as to change the gain characteristic of the variable filter unit. This design can optimize the overall performance of the system under the condition of maintaining the stability of the system.

BRIEF DESCRIPTION OF THE DRAWINGS

The instant disclosure will become more fully understood from the detailed description given herein below for illustration only, and thus not limitative of the instant disclosure, wherein:

FIG. 3-1 illustrates a schematic block diagram of an amplifier system according to some exemplary embodiments of the instant disclosure;

FIG. 3-2 illustrates a schematic block diagram of an amplifier system according to some exemplary embodiments of the instant disclosure.

DETAILED DESCRIPTION

Figure 1:
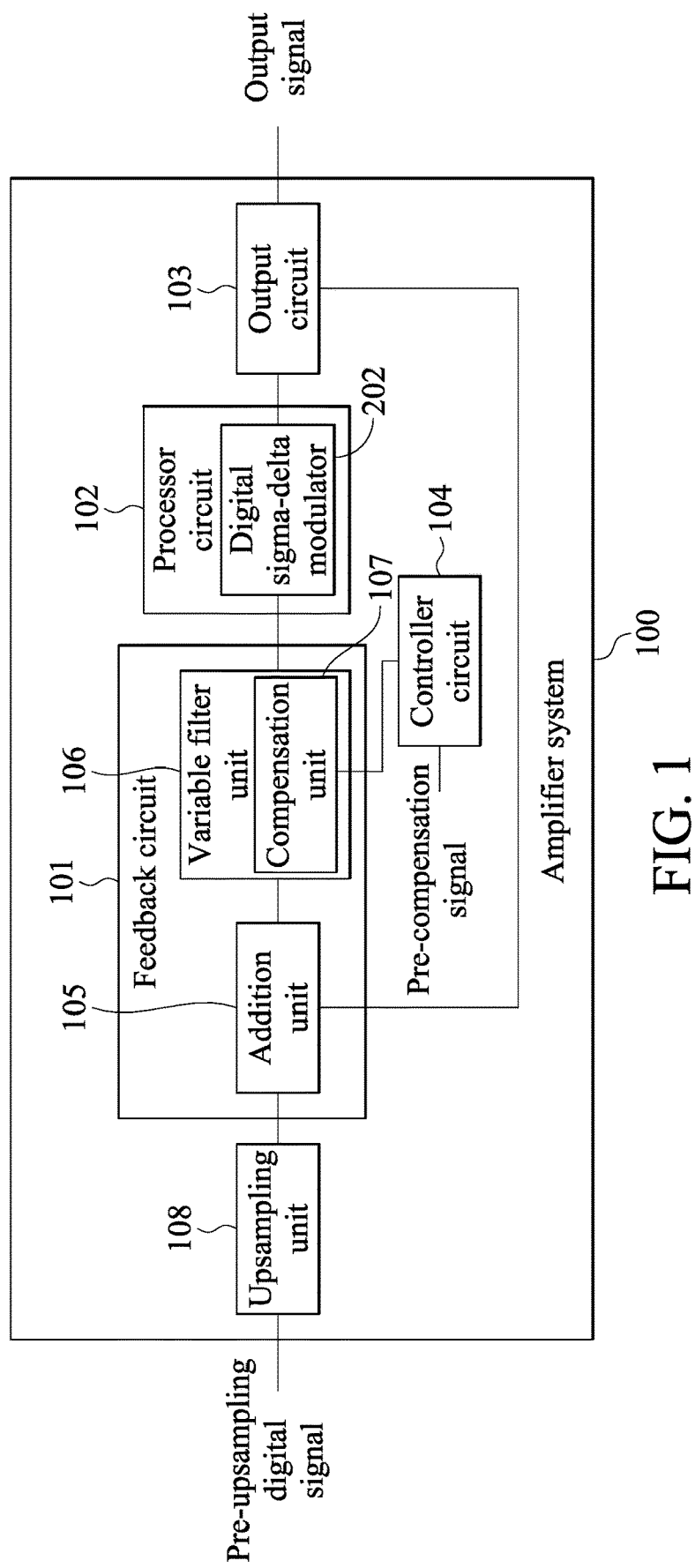
FIG. 1 illustrates a schematic block diagram of an amplifier system according to some exemplary embodiments of the instant disclosure.

The foregoing and other technical contents, features, and effects of the present invention will be clearly presented in the following detailed descriptions of the embodiments with reference to the drawings. The thicknesses or sizes of the elements in the drawings expressed in an exaggerated, omitted, or general manner are used for a person skilled in the art to understand and read, and the sizes of the elements are not all actual sizes thereof and are not intended to limit restraint conditions under which the present invention can be implemented and therefore, have no technical significance. Any modification to the structure, change to the proportional relationship, or adjustment on the size should fall within the scope of the technical content disclosed by the present invention without affecting the effects and the objectives that can be achieved by the present invention. The same reference numerals are used to indicate the same or similar elements in all of the drawings. The term "couple" or "connect" provided in the following embodiments may refer to any direct or indirect connection means.

FIG. 1 illustrates a schematic block diagram of an amplifier system 100 according to some exemplary embodiments of the instant disclosure. Please refer to FIG. 1. The amplifier system 100 comprises a feedback circuit 101, a processor circuit 102, an output circuit 103, a controller circuit 104, and an upsampling unit 108. The upsampling unit 108 is configured to receive a pre-upsampling digital signal, and the upsampling unit 108 upsamples the pre-upsampling digital signal so as to increase the sampling rate of the pre-upsampling digital signal and obtain a digital input signal. Then, the upsampling unit 108 outputs the digital input signal to an addition unit 105.

The feedback circuit 101 comprises a variable filter unit 106 and the addition unit 105. The variable filter unit 106 comprises a compensation unit 107. The addition unit 105 is configured to receive the digital input signal outputted by the upsampling unit 108 and receive a digital output feedback signal outputted by the output circuit 103. In this embodiment, the system adopts a negative feedback structure, where the addition unit 105 is configured to add the negative value of the digital output feedback signal to the digital input signal so as to obtain an error audio signal. The addition unit 105 then transmits the error audio signal to the variable filter unit 106. The variable filter unit 106 is configured to filter the error audio signal. The compensation unit 107 of the variable filter unit 106 is configured to change a gain characteristic of the variable filter unit 106.

The processor circuit 102 is configured to receive a filtered error audio signal and output a pulse width modulation (PWM) control signal to the output circuit 103. The processor circuit 102 comprises a digital sigma-delta modulator 202. The digital sigma-delta modulator 202 is configured to modulate the filtered error audio signal. The output circuit 103 is configured to output an output signal and return the digital output feedback signal. The output signal is adapted to drive a load.

As shown in FIG. 1, the amplifier system 100 has two signal paths. One of the signal paths is the forward path, and the other is the feedback path. The forward path of the amplifier system 100 is a signal path of the amplifier system 100 from the pre-upsampling digital signal to the output signal without any signal node being traveled more than once. The feedback path is a signal path from the output signal to the addition unit 105. As shown in FIG. 1, the forward path of the amplifier system 100 comprises the signal path from the upsampling unit 108, through the addition unit 105, the variable filter unit 106, the processor circuit 102, and to the output circuit 103. The feedback path of the amplifier system 100 comprises the signal path from the output circuit 103 to the addition unit 105.

The controller circuit 104 is configured to adjust at least one parameter of the compensation unit 107 according to a signal amplitude of a pre-compensation signal, which has not been compensated by the compensation unit 107, on the forward path of the amplifier system 100 so as to enable the compensation unit 107 to change the gain characteristic of the variable filter unit 106.

It is worth mentioning that, in the foregoing embodiment, the amplifier system 100 receives the pre-upsampling digital signal from the exterior, and the upsampling unit 108 upsamples the pre-upsampling digital signal to obtain the digital input signal. However, the amplifier system 100 according to the foregoing embodiment may not include the upsampling unit 108 and may directly receive the digital input signal from the exterior.

In the structure provided in the foregoing embodiment, the controller circuit 104 adjusts the at least one parameter of the compensation unit 107 according to the signal amplitude of the pre-compensation signal, which has not been compensated by the compensation unit 107, on the forward path of the amplifier system 100 so as to enable the compensation unit 107 to change the gain characteristic of the variable filter unit 106. Therefore, the overall performance of the amplifier system 100 can be optimized under the condition of maintaining the stability of the amplifier system 100.

Figure 2:
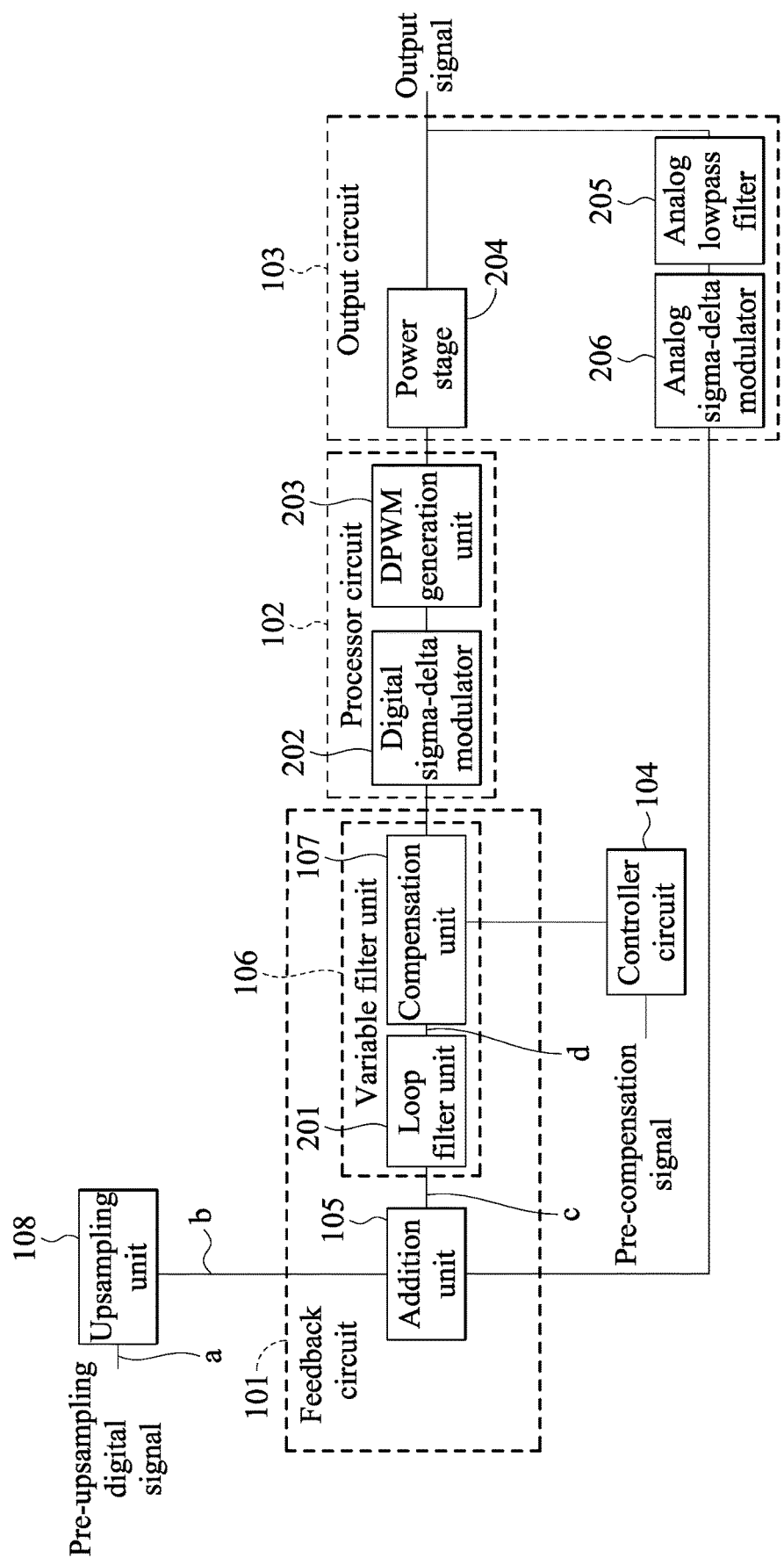
FIG. 2 illustrates a schematic block diagram of an amplifier system according to some exemplary embodiments of the instant disclosure.

FIG. 2 illustrates a schematic block diagram of the amplifier system 100 according to some exemplary embodiments of the instant disclosure. Please refer to FIG. 2. In some embodiments of the instant disclosure, the variable filter unit 106 comprises a loop filter unit 201. The loop filter unit 201 is configured to filter the error audio signal and output the filtered error audio signal to the compensation unit 107. The compensation unit 107 compensates the filtered error audio signal and then outputs the compensated error audio signal to the digital sigma-delta modulator 202 of the processor circuit 102.

The processor circuit 102 comprises a digital pulse width modulation (DPWM) generation unit 203. The digital sigma-delta modulator 202 of the processor circuit 102 receives the compensated error audio signal and transmits the compensated error audio signal after modulation to the digital pulse width modulation generation unit 203. The digital pulse width modulation generation unit 203 generates the pulse width modulation (PWM) control signal to the output circuit 103 according to the compensated error audio signal after modulation.

The output circuit 103 comprises a power stage 204, an analog lowpass filter 205, and an analog sigma-delta modulator 206. The power stage 204 is configured to receive the pulse width modulation control signal generated by the digital pulse width modulation generation unit 203 and to generate an analog output as the output signal of the output circuit 103 according to the pulse width modulation control signal. The output signal is adapted to drive a load. The analog lowpass filter 205 is configured to receive the output signal (i.e., in this embodiment, the analog output of the power stage 204) and filter the received analog output to generate an analog feedback signal. The analog sigma-delta modulator 206 is configured to receive the analog feedback signal and modulate the analog feedback signal as the digital feedback signal and then output the digital output feedback signal to the addition unit 105. In the embodiment shown in FIG. 2, the forward path of the amplifier system 100 is a signal path from the upsampling unit 108, through the addition unit 105, the variable filter unit 106, the digital sigma-delta modulator 202, the signal pulse width modulation generation unit 203, and to the power stage 204 of the output circuit 103. The feedback path of the amplifier system 100 is a signal path from the analog lowpass filter unit 205 and the analog sigma-delta modulator 206 of the output circuit 103 to the addition unit 105.

In some embodiments of the instant disclosure, the amplifier system 100 is an audio amplifier system, the power stage 204 is a class-D amplifier, and the load is a loud speaker.

As shown in FIG. 2, the pre-compensation signal, which has not been compensated by the compensation unit 107, on the forward path of the amplifier system 100 may be one of the pre-upsampling digital signal a, the digital input signal b, the error audio signal c, and the input signal d of the compensation unit 107. The controller circuit 104 is configured to adjust the at least one parameter of the compensation unit 107 according to the signal amplitude of the pre-compensation signal so as to enable the compensation unit 107 to change the gain characteristic of the variable filter unit 106.

In an embodiment of the instant disclosure, the pre-compensation signal, which has not been compensated by the compensation unit 107, on the forward path of the amplifier system 100 may be one of the pre-upsampling digital signal a, the digital input signal b, and the error audio signal c. The controller circuit 104 is configured to adjust the parameters of the loop filter unit 201 according to the signal amplitude of the pre-compensation signal so as to enable the loop filter 201 to change the overall gain characteristic of the variable filter unit 106.

Figures 1, 3:
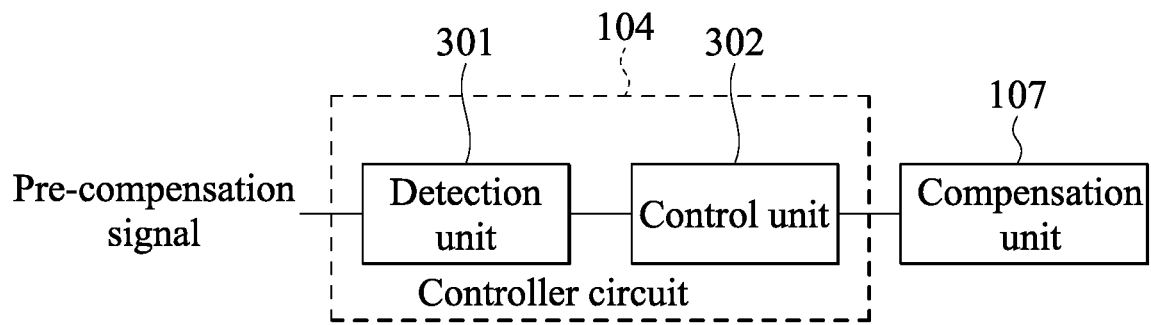
Figures 2, 3:
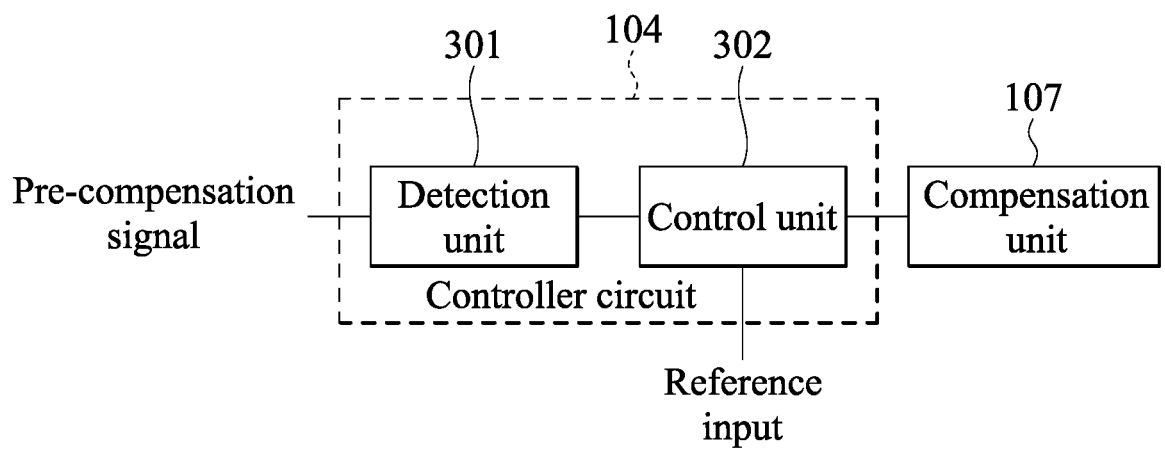

FIG. 3-1 illustrates a schematic block diagram of the amplifier 100 system according to some exemplary embodiments of the instant disclosure. Please refer to FIG. 3-1. In this embodiment, the controller circuit 104 comprises a detection unit 301 and a control unit 302. The detection unit 301 is configured to receive the pre-compensation signal and determine the signal amplitude of the pre-compensation signal. The detection unit 301 then outputs the signal amplitude of the pre-compensation signal to the control unit 302. As previously illustrated, the pre-compensation signal may be one of the pre-upsampling digital signal a, the digital input signal b, the error audio signal c, and the input signal d (i.e., the filtered error audio signal in this embodiment) of the compensation unit 107.

In some embodiments of the instant disclosure, the detection unit 301 determines the signal amplitude of the pre-compensation signal according to the amplitude of an envelope of the pre-compensation signal. In some embodiments of the instant disclosure, the detection unit 301 determines the signal amplitude of the pre-compensation signal according to the energy of the pre-compensation signal. The control unit 302 then adjusts the at least one parameter of the compensation unit 107 according to the signal amplitude.

FIG. 3-2 illustrates a schematic block diagram of the amplifier system 100 according to some exemplary embodiments of the instant disclosure. Compared with the controller circuit 104 shown in FIG. 3-1, the control unit 302 of the controller circuit 104 shown in FIG. 3-2 further receives a reference input from the exterior. The control unit 302 then adjusts the at least one parameter of the compensation unit 107 according to the signal amplitude of the pre-compensation signal and the reference input. The specific embodiment related to the reference input will be illustrated by the following embodiment.

Please refer to FIG. 1, FIG. 2, and FIG. 3-1 at the same time. In some embodiments of the instant disclosure, the compensation unit 107 is a signal proportional amplification unit. The signal proportional amplification unit amplifies the received signal according to the proportional parameter of the signal proportional amplification unit itself. Of course, it should be mentioned that, when the proportional parameter of the signal proportional amplification unit is less than 1, the signal proportional amplification unit actually reduces the received signal. The compensation unit 107 is configured to amplify (or actually reduce when the proportional parameter is less than 1) the filtered error audio signal according to the proportional parameter of the compensation unit 107 itself. The controller circuit 104 is configured to adjust the proportional parameter of the compensation unit 107 according to the signal amplitude of the pre-compensation signal, which has not been compensated by the compensation unit 107, on the forward path of the amplifier system 100. Changing the proportional parameter of the compensation unit 107 changes the overall gain characteristic of the variable filter unit 106.

Please refer to FIG. 1, FIG. 2, and FIG. 3-2 at the same time. In some embodiments of the instant disclosure, the compensation unit 107 is a signal proportional amplification unit, the reference input is a threshold, and the controller circuit 104 is configured to compare the signal amplitude of the pre-compensation signal with the threshold. When the signal amplitude of the pre-compensation signal is greater than the threshold, the controller circuit 104 adjusts the proportional parameter of the compensation unit 107 as a first proportional parameter. When the signal amplitude of the pre-compensation signal is less than or equal to the threshold, the controller circuit 104 adjusts the proportional parameter of the compensation unit 107 as a second proportional parameter.

Please refer to FIG. 1, FIG. 2, and FIG. 3-2 at the same time. In some embodiments of the instant disclosure, the compensation unit 107 is a signal proportional amplification unit, the reference input is a table recording the correspondence relationship between the signal amplitude of the pre-compensation signal and the proportional parameter of the compensation unit 107, and the controller circuit 104 is configured to adjust the proportional parameter of the compensation unit 107 according to the signal amplitude of the pre-compensation signal and the correspondence relationship recorded in the table.

Figure 4:
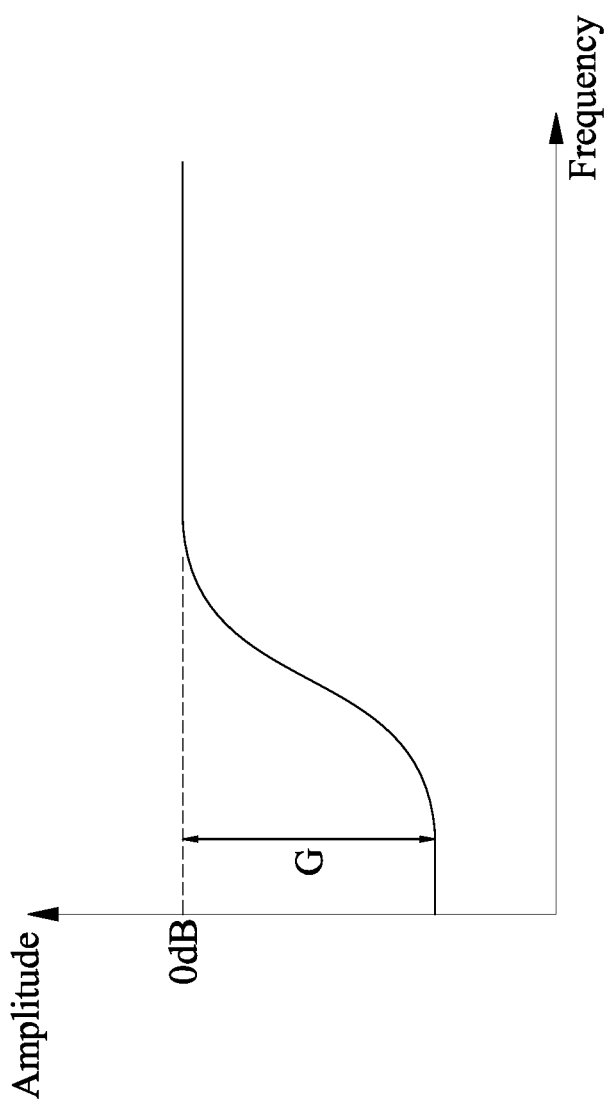
FIG. 4 illustrates a schematic amplitude response of a low-frequency shelving filter according to some exemplary embodiments of the instant disclosure.

FIG. 4 illustrates a schematic amplitude response of a low-frequency shelving filter according to some exemplary embodiments of the instant disclosure. Please refer to FIG. 1, FIG. 2, FIG. 3-1, and FIG. 4 at the same time. In some embodiments of the instant disclosure, the compensation unit 107 is a low-frequency shelving filter. In this embodiment, the compensation unit 107 may be represented by the following transfer function (Equation 1):
where $$H_{LS}(z) = \frac{b_0 + b_1 z^{-1}}{a_0 + a_1 z^{-1}}, \quad \text{(Equation 1)}$$

$$b_0 = g \tan\left(\frac{\omega_c}{2}\right) + \sqrt{g}, \, b_1 = g \tan\left(\frac{\omega_c}{2}\right) - \sqrt{g},$$

$$a_0 = \tan\left(\frac{\omega_c}{2}\right) + \sqrt{g}, \, a_1 = \tan\left(\frac{\omega_c}{2}\right) - \sqrt{g},$$

and $\omega_c$ and g are positive real numbers.

The compensation unit 107 has low-frequency shelving filter coefficients $\omega_c$, g, $a_0$, $a_1$, $b_0$, and $b_1$, where the low-frequency shelving filter coefficients $\omega_c$ and g can determine $a_0$, $a_1$, $b_0$, and $b_1$. The amplitude response of the compensation unit 107 is shown in FIG. 4, where $G=-20 \log^{10g}$, and G is the gain of the low-frequency shelving filter at low frequencies. The low-frequency shelving filter coefficient $\omega_c$ determines the cutoff frequency of the amplitude response of the compensation unit 107 shown in FIG. 4.

The controller circuit 104 is configured to adjust the low-frequency shelving filter coefficients $\omega_c$ and g according to the signal amplitude of the pre-compensation signal, so as to adjust the gain G of the low-frequency shelving filter and thus change the overall gain characteristic of the variable filter unit 106.

Please refer to FIG. 1, FIG. 2, and FIG. 3-2 at the same time. In some embodiments of the instant disclosure, the compensation unit 107 is the low-frequency shelving filter, and the transfer function of the compensation unit 107 is the Equation 1. The reference input is a table recording the correspondence relationship between the signal amplitude of the pre-compensation signal and the low-frequency shelving filter coefficients co, and g ($a_0$, $a_1$, $b_0$, $b_1$) of the compensation unit 107. The controller circuit 104 is configured to adjust the low-frequency shelving filter coefficients $\omega_c$ and g ($a_0$, $a_1$, $b_0$, $b_1$) of the compensation unit 107 according to the signal amplitude of the pre-compensation signal and the correspondence relationship recorded in the table.

It is worth mentioning that, in the foregoing embodiment, the compensation unit 107 adopts a first order low-frequency shelving filter. Of course, the compensation unit 107 may also adopt a second order or higher order low-frequency shelving filter, and thus the instant disclosure is not limited thereto.

As above, some embodiments of the instant disclosure provide an amplifier system 100. The controller circuit 104 of the amplifier system 100 adjusts the at least one parameter of the compensation unit 107 according to the signal amplitude of the pre-compensation signal, which has not been compensated by the compensation unit 107, on the forward path of the amplifier system 100 so as to change the gain characteristic of the variable filter unit 106. This design can optimize the overall performance of the amplifier system 100 under the condition of maintaining the system to be stable.

What is claimed is:

1. An amplifier system comprising:
an output circuit configured to output an output signal so as to drive a load and configured to return a digital output feedback signal;
a processor circuit comprising a digital sigma-delta modulator, wherein the processor circuit is configured to receive a filtered error audio signal and output a pulse width modulation (PWM) control signal to the output circuit according to the filtered error audio signal;
a feedback circuit comprising a variable filter unit and an addition unit, wherein the variable filter unit comprises a compensation unit, the addition unit is configured to add a negative value of the digital output feedback signal to a digital input signal so as to obtain an error audio signal and transmit the error audio signal to the variable filter unit, the variable filter unit is configured to filter the error audio signal and output the filtered error audio signal, and the compensation unit of the variable filter unit is configured to change a gain characteristic of the variable filter unit; and
a controller circuit configured to adjust at least one parameter of the compensation unit according to a signal amplitude of a pre-compensation signal, which has not been compensated by the compensation unit, on a forward path of the amplifier system so as to enable the compensation unit to change the gain characteristic of the variable filter unit,
wherein the controller circuit comprises a detection unit and a control unit, the detection unit is configured to receive the pre-compensation signal and output the signal amplitude of the pre-compensation signal, and the control unit adjusts the at least one parameter of the compensation unit according to the signal amplitude.

2. The amplifier system according to claim 1, wherein the control unit adjusts the at least one parameter of the compensation unit further according to a reference input.

3. The amplifier system according to claim 2, wherein the detection unit is configured to determine the signal amplitude of the pre-compensation signal according to an envelope of the pre-compensation signal.

4. The amplifier system according to claim 2, wherein the detection unit is configured to determine the signal amplitude of the pre-compensation signal according to an energy of the pre-compensation signal.

5. The amplifier system according to claim 1, wherein the detection unit is configured to determine the signal amplitude of the pre-compensation signal according to an envelope of the pre-compensation signal.

6. The amplifier system according to claim 1, wherein the detection unit is configured to determine the signal amplitude of the pre-compensation signal according to an energy of the pre-compensation signal.

7. The amplifier system according to claim 1, wherein the pre-compensation signal is selected from the group consisting of the digital input signal, the error audio signal, and an input signal of the compensation unit.

8. The amplifier system according to claim 1, wherein the amplifier system further comprises an upsampling unit, the upsampling unit is configured to receive a pre-upsampling digital signal, and the upsampling unit upsamples the pre-upsampling digital signal and outputs the digital input signal.

9. The amplifier system according to claim 8, wherein the pre-compensation signal is selected from the group consisting of the pre-upsampling digital signal, the digital input signal, the error audio signal, and an input signal of the compensation unit.

10. The amplifier system according to claim 1, wherein the variable filter unit further comprises a loop filter unit, the loop filter unit is configured to receive the error audio signal, and the loop filter unit filters and outputs the error audio signal to the compensation unit.

11. The amplifier system according to claim 1, wherein the compensation unit is a low-frequency shelving filter, the low-frequency shelving filter comprises a plurality of coefficients, the at least one parameter of the compensation unit includes the coefficients of the low-frequency shelving filter, the controller circuit is configured to adjust the coefficients of the low-frequency shelving filter according to the signal amplitude of the pre-compensation signal so as to adjust a gain of the low-frequency shelving filter so as to change the gain characteristic of the variable filter unit.

12. The amplifier system according to claim 1, wherein the compensation unit is a low-frequency shelving filter, the low-frequency shelving filter comprises a plurality of coefficients, the at least one parameter of the compensation unit includes the coefficients of the low-frequency shelving filter, the controller circuit is configured to adjust the coefficients of the low-frequency shelving filter according to the signal amplitude of the pre-compensation signal and a reference input so as to adjust a gain of the low-frequency shelving filter so as to change the gain characteristic of the variable filter unit.

13. The amplifier system according to claim 1, wherein the compensation unit is a signal proportional amplification unit, and the controller circuit is configured to adjust a proportional parameter of the signal proportional amplification unit according to the signal amplitude of the pre-compensation signal so as to change the gain characteristic of the variable filter unit.

14. The amplifier system according to claim 1, wherein the compensation unit is a signal proportional amplification unit, and the controller circuit is configured to adjust a proportional parameter of the signal proportional amplification unit according to the signal amplitude of the pre-compensation signal and a reference input so as to change the gain characteristic of the variable filter unit.

15. The amplifier system according to claim 1, wherein the processor circuit further comprises a digital pulse width modulation generation unit, the digital sigma-delta modulator of the processor circuit receives the filtered error audio signal, the digital sigma-delta modulator transmits the filtered error audio signal after modulation to the digital pulse width modulation generation unit, and the digital pulse width modulation generation unit generates the pulse width modulation control signal to the output circuit according to the filtered error audio signal after modulation.

16. The amplifier system according to claim 1, wherein the processor circuit further comprises a power stage, an analog lowpass filter, and an analog sigma-delta modulator, the power stage is configured to receive the pulse width modulation control signal and generate an analog output according to the pulse width modulation control signal, the analog lowpass filter is configured to receive the analog output and generate an analog feedback signal according to the analog output, and the analog sigma-delta modulator is configured to receive the analog feedback signal and modulate the analog feedback signal and then output the digital output feedback signal.

17. The amplifier system according to claim 16, wherein the power stage is a class-D amplifier.

* * * * *